United States Patent
Johnson

[11] Patent Number: 6,114,847
[45] Date of Patent: Sep. 5, 2000

[54] CONNECTIONLESS SIGNAL DETECTION DEVICE FOR CONDUCTIVE CABLES

[76] Inventor: Darrell Johnson, 4011 Camino Alegre, La Mesa, Calif. 91941

[21] Appl. No.: 08/538,639

[22] Filed: Oct. 4, 1995

[51] Int. Cl.⁷ .................................................. G01R 1/22
[52] U.S. Cl. ........................ 324/127; 324/126; 324/117 R
[58] Field of Search ............................... 324/158.1, 73.1, 324/117 R, 126, 127; 336/176, 178, 212

[56] References Cited

U.S. PATENT DOCUMENTS

| | | | |
|---|---|---|---|
| 1,952,072 | 3/1934 | Jewell | 324/117 R |
| 2,153,378 | 4/1939 | Kramer | 324/117 R |
| 2,780,779 | 2/1957 | Hansen, Jr. | 324/117 R |
| 2,831,164 | 11/1958 | Johnson | 324/127 |
| 2,915,707 | 12/1959 | Bradstock et al. | 324/127 |
| 3,657,650 | 4/1972 | Arndt | 324/126 |
| 3,708,749 | 1/1973 | Bateman et al. | 324/127 |
| 4,182,982 | 1/1980 | Wolf | 324/127 |
| 4,240,059 | 12/1980 | Wolf | 338/49 |
| 4,378,525 | 3/1983 | Burdick | 324/117 R |
| 4,438,394 | 3/1984 | Ekdahl | 324/126 |
| 4,506,214 | 3/1985 | Lienhard | 324/117 R |
| 4,513,246 | 4/1985 | Blain | 324/127 |
| 4,513,274 | 4/1985 | Halder | 324/127 |
| 4,626,777 | 12/1986 | Ainsworth | 324/117 R |
| 4,719,414 | 1/1988 | Miller | 324/95 |
| 4,728,887 | 3/1988 | Davis . | |
| 4,791,361 | 12/1988 | Beihoff | 324/127 |
| 4,794,326 | 12/1988 | Friedl | 324/117 R |
| 4,794,327 | 12/1988 | Fernandes | 324/127 |
| 4,804,917 | 2/1989 | Miller | 324/95 |
| 4,810,989 | 3/1989 | Brandenburg | 336/84 M |
| 4,912,396 | 3/1990 | Groenenboom | 324/117 R |
| 5,049,809 | 9/1991 | Watatsuki | 324/117 R |

*Primary Examiner*—Vinh P. Nguyen

[57] ABSTRACT

A connectionless signal detection device for conductive cables contains one or more bifurcated, wire-wrapped magnetic core assemblies positioned axially in an elongated alignment channel, allowing the device to accurately detect the transmission of signals or information on conductive cables using an inductive method. Each assembly section of the magnetic core assembly is wrapped with a conducting wire, with opposed assembly sections electrically connected in a bucking configuration, that is, the output side of one assembly section is connected to the output side of the opposing assembly section. The assembly sections either mate directly at their intersections or alternately operate with a dual gap. The elongated alignment channel opens and closes to allow positioning of the magnetic core assemblies concentrically about a conductive cable. The device operates in a connectionless mode and so is able to detect and monitor data transmission without physical, electrical, or logical interference to the conductive cable. The conductive cable may physically be any conductive cable type, including coaxial, twisted pair, or single conductor; electrically be operating at any level; and logically be transmitting using any protocol.

4 Claims, 4 Drawing Sheets

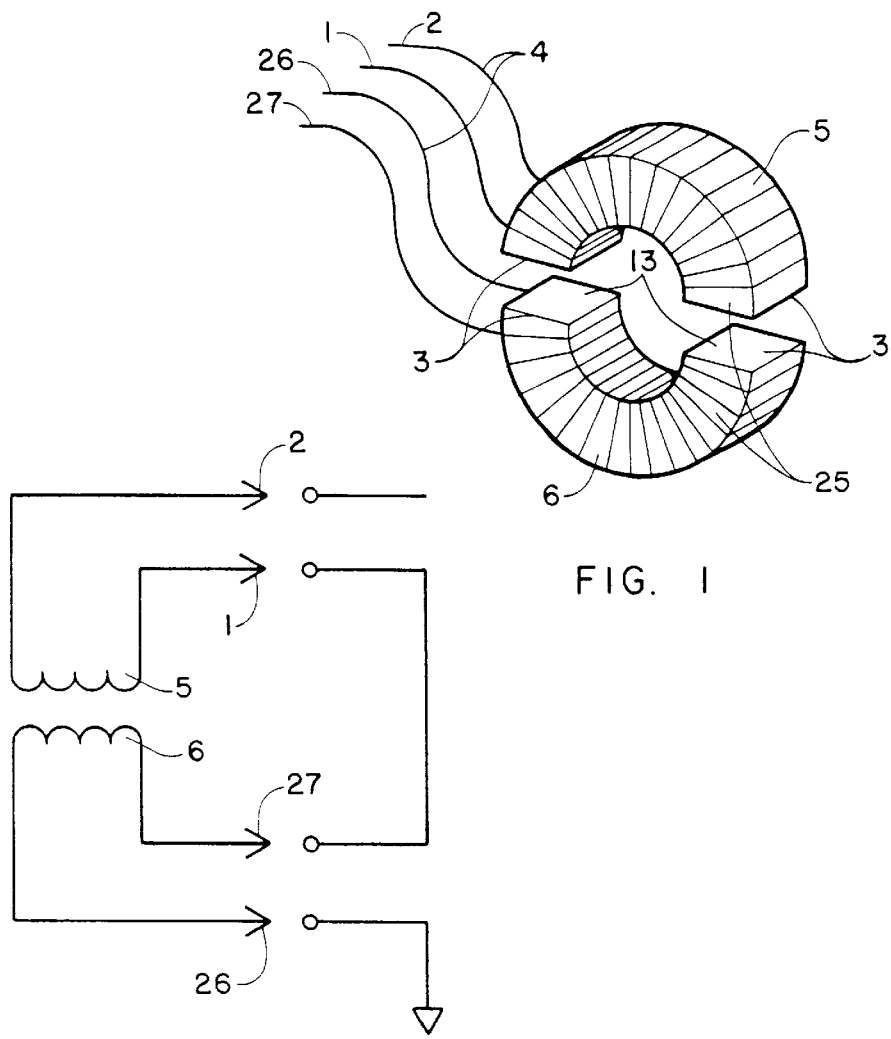
FIG. 1
FIG. 2
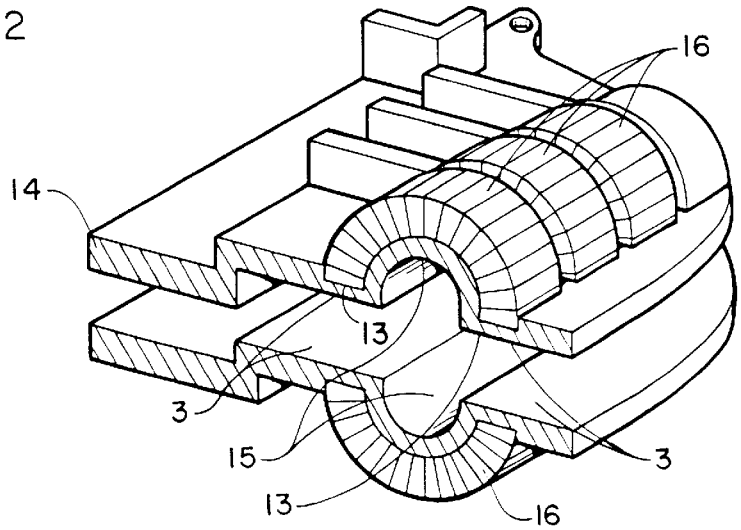
FIG. 3

CONNECTIONLESS SIGNAL DETECTION DEVICE FOR CONDUCTIVE CABLES

FIELD OF THE INVENTION

The field of invention is inductive signal detection.

BACKGROUND OF THE INVENTION

The means to non-intrusively detect and measure electric current on conductive cables through induction techniques is well known and described in the prior art. For example, see U.S. Pat. No. 4,804,917 "Current Detection Device Having an Extended Frequency Range of Response," which discloses a device designed to detect current in a broad range of frequencies. The '917 device detects a drop in voltage on a conductive substrate to detect current over a wide frequency range, with the invention targeted to detecting the presence of electronic noise on coaxial cables. Additionally, U.S. Pat. No. 4,794,326 as well as U.S. Pat. Nos. 4,182,982 and 4,240,059 referenced therein further describe inductive detection technologies.

The prior art suffers from a number of deficiencies, including:

a. The prior art including the '917 device requires the target cable system under test to be made inoperable, the cable threaded through the signal detection device, and the cable system restarted in order to detect voltages, currents, and data signals on the cable.

b. The prior art cannot adequately handle various types of conductive cables including coaxial and shielded or unshielded twisted pair cables.

c. The prior art does not detect more than one networking communication signal frequency.

d. The prior art does not have sufficient sensitivity for certain applications including detecting small signals on local area network LAN cables.

e. The prior art lacks a cable alignment mechanism to ensure accurate signal detection.

SUMMARY OF THE INVENTION

The present invention is directed to a connectionless signal detection device for conductive cables.

A first, separate aspect of the present invention is a device that nonintrusively detects signals on conductive cables.

A second, separate aspect of the present invention is a signal detection device that detects signals on conductive cables without interrupting the cable system. The signal detection device of the present invention attaches nonintrusively to the cable being monitored and therefore does not require the cable to be disconnected, the detection means attached and then the cable system reconnected.

A third, separate aspect of the present invention is a signal detection device having magnetic core assemblies that are connected electrically in a bucking fashion.

Another separate aspect of the present invention is a signal detection device having an elongated cable alignment channel to allow proper alignment of the cable with the signal detection device for sufficient inductive coupling.

Yet another separate aspect of the present invention is a signal detection device whose magnetic core assembly can operate in the voltage mode rather than the current mode.

Still another separate aspect of the present invention is a signal detection device that functions with the inductive magnetic core assembly operating with or without a gap at each mating interface between magnetic core assembly sections. In a bifurcated magnetic core assembly, the mating surfaces form a dual intersection.

Another separate aspect of the present invention is a signal detection device that can detect signals on multiple types of conductive cables including coaxial cable and shielded and unshielded twisted pair cable.

BRIEF DESCRIPTIONS OF THE DRAWINGS

FIG. 1 illustrates a perspective view of a bifurcated magnetic core assembly.

FIG. 2 illustrates an electrical schematic of the bucking circuit for a magnetic core assembly used in an embodiment of the present invention.

FIG. 3 illustrates a perspective view of an elongated alignment channel and three magnetic core assemblies.

DESCRIPTION OF THE PREFERRED EMBODIMENT

Figure 4:
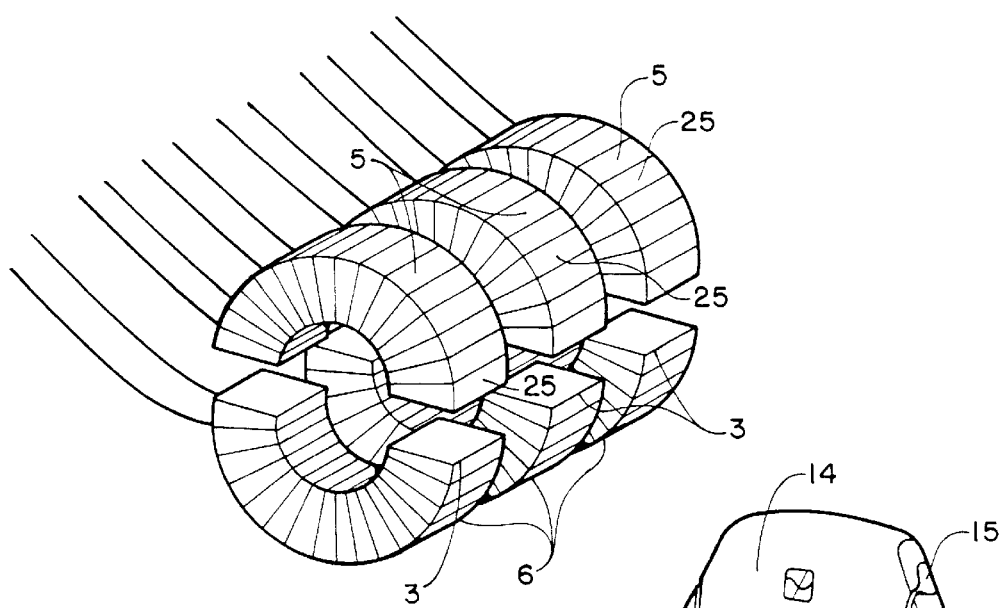
FIG. 4 illustrates a perspective view of a multiple magnetic core assembly configuration used in an embodiment of the present invention.

The connectionless signal detection device for conductive cables is an easy to use, economical, and precise device for use in test, repair, design, optimization, and operation of a signal or information transmission system utilizing conductive cables. The device may be hand-held for portable operations or incorporated into a system for a specific purpose.

Typically, when a problem is detected in a signal or information transmission system, the system must be interrupted to allow the attachment of an intrusive test device. The intrusive device may add problems to the system, or mask the real cause of the data transmission problem. The connectionless signal detection device for conductive cables has four major features that uniquely allow the device to work with the signal or information transmission system.

First, the assembly sections of the magnetic core assemblies are connected electrically in a bucking fashion. This connection method produces an order of magnitude improvement in sensitivity over the typical series or parallel connection methods, allowing accurate detection of the data signals on any conductive cable. The bucking connection method produces a synergistic and dramatic increase in sensitivity.

Second, the elongated alignment channel allows the target cable to be positioned accurately for sufficient inductive coupling between the signal on the cable and the magnetic core assembly. Inductive efficiency is increased by reducing losses due to the angle of misalignment between the cable and the magnetic core assembly.

Third, the inductive magnetic core assembly is operated in a voltage mode rather than the usual current mode. Operating in the voltage mode increases the inductive coupling efficiency. By operating in a voltage mode, the gain is increased in proportion to the number of turns on the magnetic core assemblies, increasing the signal detection capability of the device.

Fourth, the device functions with the inductive magnetic core assembly operating with a gap at each mating surface interface between the magnetic core assembly sections. With a bifurcated magnetic core assembly, the mating surfaces of the assembly sections are separated by a dual gap. The presence of this dual gap allows for reduced manufacturing cost as the need to create one or more precision mating surfaces is eliminated. Also, the dual gap configuration allows the bifurcated magnetic core assembly to be easily opened and closed for rapid positioning about a conductive cable. The connectionless signal detection device for conductive cables is intended to passively detect electrical signals on conductive cables without physical, electrical, or logical interference with signal or information transmission. When the device is passively detecting one or more signals on the conductive cable, the device relates the instantaneous presence of one or more signals to subsequent processing circuitry. The processing circuitry then enables the connectionless signal detection device to monitor, analyze, display, or post-process the signal information to satisfy a particular testing, monitoring, or informational need.

The connectionless signal detection device is placed on the conductive cable using an elongated alignment channel to correctly position the magnetic core assemblies concentrically around the conductive cable. The elongated alignment channel opens to allow the conductive cable to be easily placed inside one or more magnetic core assembly sections. The elongated alignment channel is then closed, which brings the two magnetic core assembly sections together, separated by a gap at both mating surfaces, and properly aligns the cable for maximum inductive coupling with the magnetic core assembly.

Figure 5:
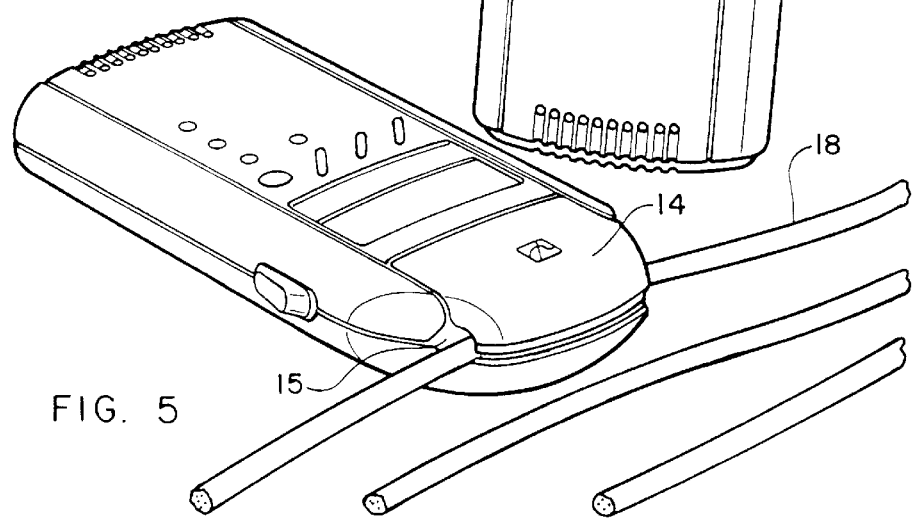
FIG. 5 illustrates the front and perspective views of a conectionless signal detection device that embodies the present invention.

A preferred embodiment of the connectionless signal detection device for conductive cables according to the present invention is shown in FIG. 5, with FIGS. 1 through 3 showing details of the preferred embodiment. Referring to FIG. 1, a magnetic core assembly 25 is shown, comprised of the annular magnet core bifurcated into a first magnetic core section 5 and a second magnetic core assembly 6. The first and second magnetic core sections 5, 6 are positioned opposed to each other with the interface between the two sections forming a gap 13 at the mating surface 3. Each magnetic core section is wrapped with an insulated conductive wire 4 with the wire having an input connection 2 or 26 and an output connection 1 or 27. The first and second assembly section 5, 6 of the magnetic core assembly are independently wrapped with the conducting wire 4, with one end of the wire acting as an input 2 or 26 and the other end acting as the output 1 or 27.

FIG. 2 shows the schematic of the electrical bucking configuration used in the connectionless signal detection device. The opposing magnetic core assembly sections 5, 6 are electrically connected in a bucking fashion, that is, the output wire 1 to the upper assembly section 5 is connected to the output wire 27 of the opposing lower assembly section 6. The input wires 2, 26 to the first and second magnetic core assembly sections are then connected to the post processing circuitry (not shown).

A perspective view of a representation of the preferred elongated alignment channel is shown in FIG. 3. The elongated alignment channel 15 is in a tubular shape, and created from a molded plastic. The first and second magnetic core assembly sections are placed about the tubular channel and held in place by insertion into magnetic core assembly section holders 16. The opening mechanism is a simple hinging device 14. In the preferred embodiment, the elongated alignment channel 15 is approximately three inches in length, although this is significantly longer than necessary to achieve proper alignment. The approximately three inch length was selected for aesthetic and industrial design concerns.

In the preferred embodiment as shown in FIG. 3, at least one bifurcated magnetic core assembly is positioned axially about an elongated alignment channel 15 in a magnetic core assembly section holder 16. The magnetic core assemblies are not visible in the perspective drawing as the magnetic core assemblies are positioned in the magnetic core assembly holders 16. A hinged opening mechanism 14 allows the magnetic core assembly holders 16 to open wide enough to allow a conductive cable to be placed in the elongated alignment channel 15. After the cable is positioned in the elongated alignment channel 15, the hinged opening mechanism 14 allows the magnetic core assembly holders to close. Where the first and second magnetic core assembly sections meet, a mating surface 3 is formed. A gap 13 is formed at each mating surface 3; thus precision grinding of the mating surfaces is not required.

The magnetic core assembly acts as a highly sensitive inductive device. The wire-wrapped magnetic core assembly and associated circuitry is operated in a voltage mode, increasing detection sensitivity. Commonly, inductive detection is done in a current mode, where an increase in the number of turns on the detecting device will decrease the current induced. In voltage mode, the voltage induced in the magnetic core assembly is increased by the use of more turns of wire on the magnetic core assembly. By operating in a voltage mode, detection sensitivity is increased.

By adjusting the Q of the circuitry, the magnetic core assembly may be optimized to specific frequencies. To those familiar with the art, Q is a measurement of a circuit's response to a particular frequency. By adjusting detection circuitry characteristics, the Q can be adjusted on a continuum. A low Q detection device would have a limited sensitivity over a wide frequency range, whereas a high Q system would have excellent sensitivity over a smaller frequency band. The use of a plurality of bifurcated magnetic core assemblies allows each assembly to have a higher Q value tuned to detect a particular frequency or frequency range. Since the connectionless signal detection device as embodied in FIG. 5 is looking for specific, known frequencies, the Q of the magnetic core assembly detection circuits can be adjusted high, specifically for a particular frequency. Q tuning is done by adjusting the capacitor 30, 31, or 32 shown in FIG. 7, allowing the detection circuitry to resonate at the specific, desired frequency. The capacitor is presently adjusted by the use of an adjustable trimmer capacitor or by manually selecting a fixed capacitor value. The adjustment method used for the embodiment shown in FIG. 5 is manual and preset for a particular frequency, but optionally may be automated through the use of an autosensing and adjustment circuit known to those skilled in the art.

Referring to FIGS. 1 and 3, the operation of the connectionless signal detection device is as follows:

a. the elongated alignment channel opening mechanism 14 permits access to the elongated alignment channel 15;

b. the conductive cable to be examined is placed in the exposed elongated alignment channel 15;

c. the opening mechanism 14 closes the elongated alignment channel 15, positioning the magnetic core assembly sections concentrically around the conductive cable to be examined;

d. the cable self-aligns in the alignment channel 15, minimizing misalignment losses; the magnetic core assembly section mating surfaces 3 are separated by small gaps 13, as no precision mating surfaces are necessary;

e. commonly known supporting circuitry is used to filter the voltage induced on output lines 11 and 12 in the magnetic core assembly bucking circuit as shown in FIG. 2; the filter is a simple bandpass circuit that passes signals near the target frequency but blocks unwanted signals at higher or lower frequencies, thus providing a higher quality signal for further processing;

f. the induced filtered voltage is analyzed and displayed using commonly known circuitry and components.

A connectionless signal detection device for conductive cables which embodies the present invention is made by Psiber Data Systems Inc., the PsiberNET Connectionless LAN Monitor. FIG. 5 shows a front view and a perspective view of the PsiberNET. The PsiberNET has a hinging device 14 which allows access to the elongated alignment channel 15. A conductive data cable 18 is placed in the alignment channel 15 and the access closed.

Figure 7:
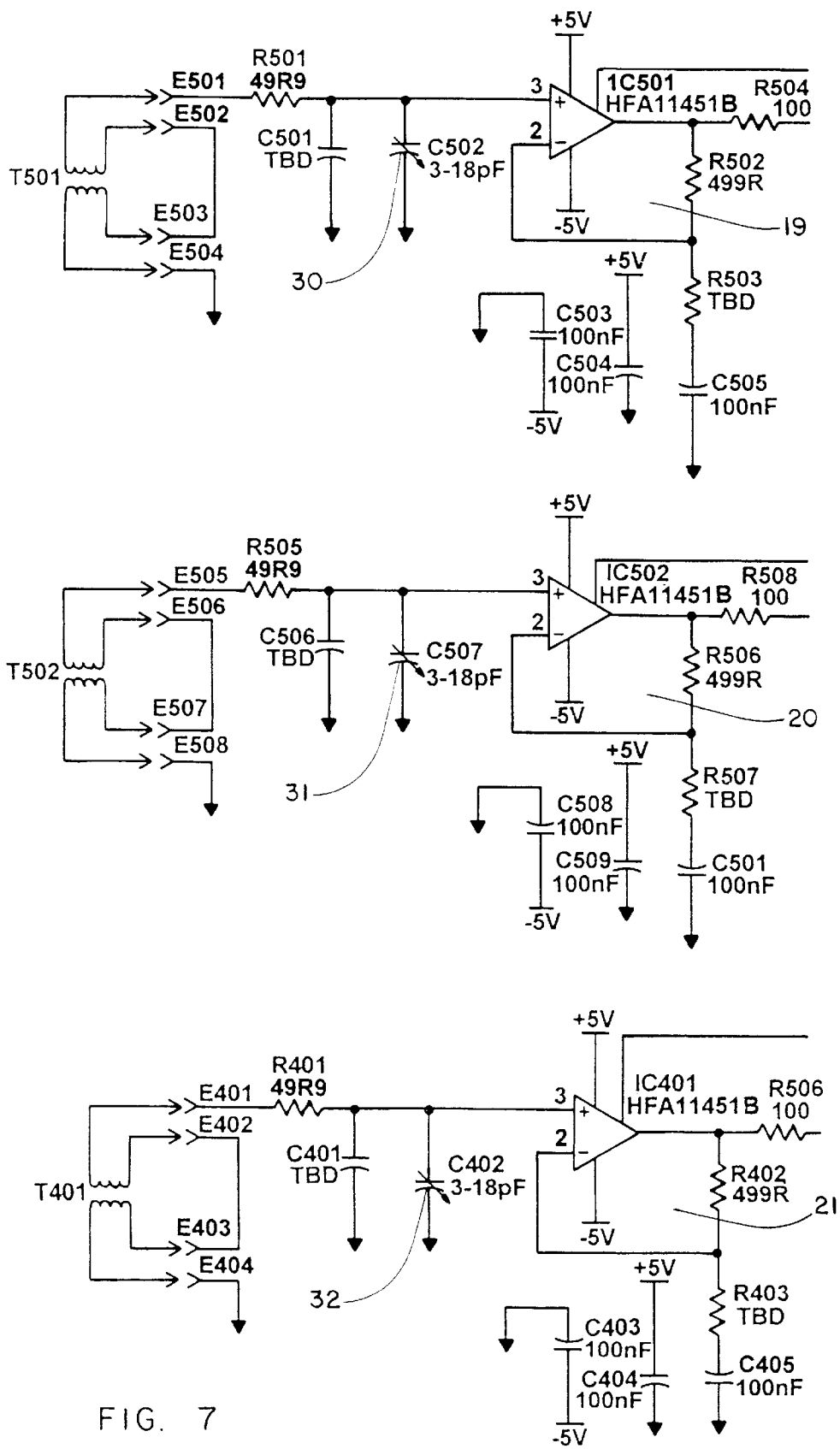
FIG. 7 illustrates an electrical schematic of an embodiment of the present invention which uses three magnetic core assemblies.

The PsiberNET uses a wire-wrapped magnetic core in a torroid shape, bifurcated into two equal hemispheres as the magnetic core assembly. The magnetic core assembly as used in the PsiberNET Connectionless LAN Monitor is shown in perspective view in FIG. 4. FIG. 4 shows three magnetic core assemblies 25 comprised of first magnetic core assembly sections 5 and second magnetic core assembly sections 6. The first and second sections are positioned opposed to each other and form a gap at the mating surface 3. The PsiberNET uses three magnetic core assemblies, each tuned to a particular frequency, to detect the presence, quality, and quantity of data signals on a conductive cable. Three magnetic core assemblies are used, with each magnetic core assembly tuned to detect one popularly used frequency. The three magnetic core assemblies are tuned to 16 MHz, 10 MHz, and 4 MHz, which correspond to the popular data communication network types of 16 Mbps (Megabits per second) Token ring, 10 Mbps Ethernet and 4 Mbps Token Ring. The schematics for each of the magnetic core assemblies, including selected supporting circuitry for filtering and conditioning, are shown in FIG. 7. FIG. 7 shows three magnetic core assembly circuits 19, 20 and 21. The circuit for each magnetic core assembly is tuned to more precisely detect a particular frequency. The three frequencies chosen represent common transmission rates for popular Local Area Network protocols.

Figure 6:
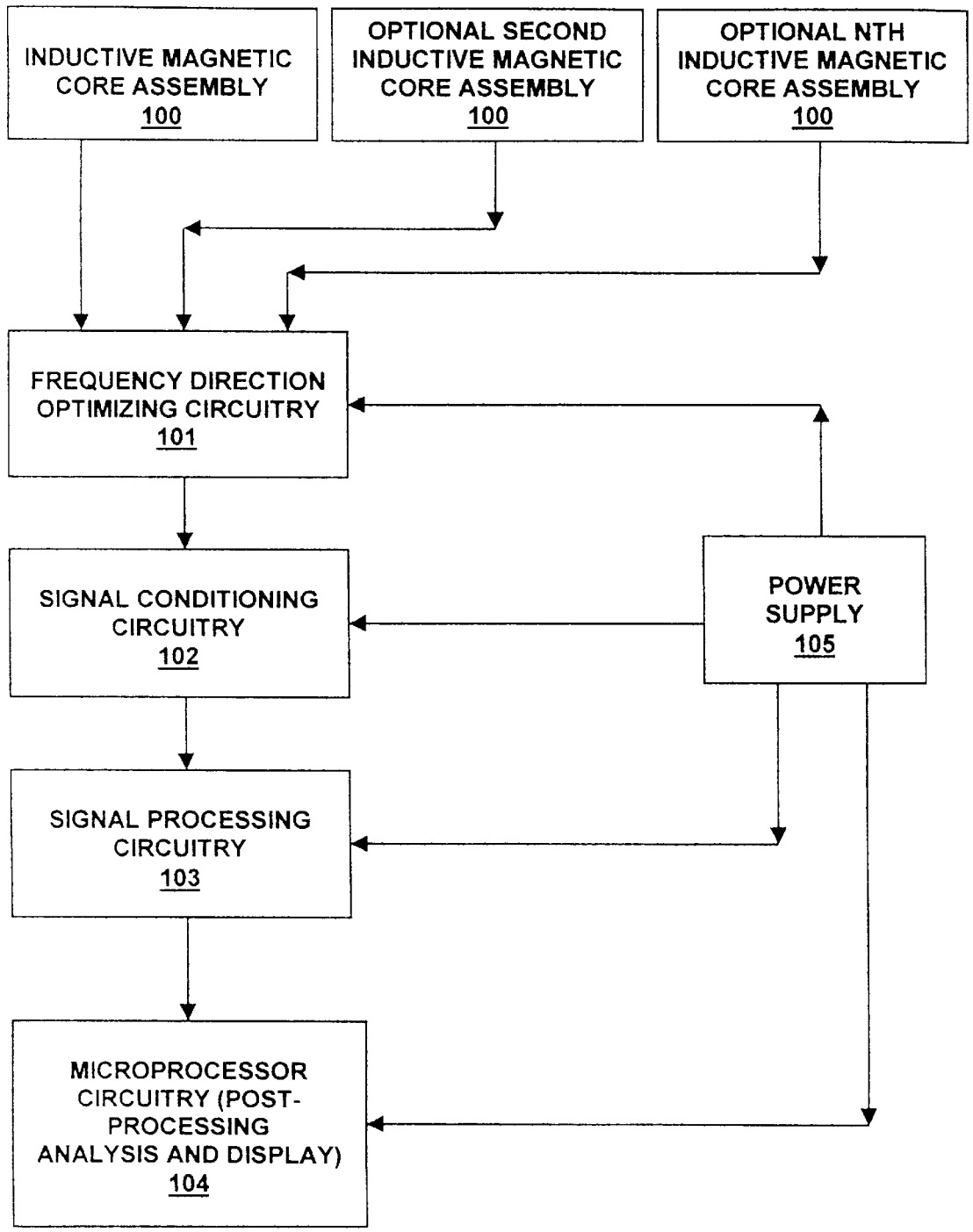
FIG. 6 illustrates a functional block diagram of the major internal components of an embodiment of the present invention.

FIG. 6 shows a block diagram of the operational flow for the preferred embodiment of the connectionless signal detection device. One or more assemblies 100 can be used to detect the presence of signals on conductive cables. Any electromagnetic activity on the conductive cable will induce a voltage in a magnetic core assembly. Tuning circuitry 101 optimizes a magnetic core assembly for a particular frequency. Sensitivity can be increased for a particular frequency, leading to a higher degree of accuracy in detection. The induced signal is conditioned by signal conditioning circuitry 102. Conditioning can include such commonly known processes as filtering or amplifying. Conditioning improves the quality of the induced signal so it can be more accurately processed in later circuitry. The conditioned signal is then sent to additional signal processing circuitry 103 for post processing. Post processing can include commonly known processes such as counting data bits or calculating rates and usages. This information is then communicated to the operator or the system controller, here shown as a microprocessor 104. The operator or the microprocessor can also control the operation of the device. The power supply 105 provides power to operate the connectionless signal detection device and its components.

The connectionless signal detection device for conductive cables allows electrically non-intrusive access to signal information on any conductive cable in a signal or information transmission system. This gives a user the ability to troubleshoot or monitor data or other signals without changing the system configuration or interrupting the system operation. Additionally, intermittent conditions are easier to diagnose as the physical and electrical properties of the data transmission system are not affected by the attachment of the device. Interfacing methods that require physical or electrical connection can mask intermittent problems or add new ones. The connectionless signal detection device for conductive cables avoids this problem by providing a non-intrusive attachment method. Additionally, the connectionless signal detection device works on any conductive cable type, including coaxial, shielded or unshielded twisted pair, or single conductor. Also, the connectionless signal detection device detects any type of data transmission protocol, including Ethernet, 4 or 16 Mb/sec. Token ring, and EtherTalk.

The connectionless signal detection device for conductive cables easily attaches to the target test cable. Typical alignment difficulties are avoided by using an elongated alignment channel that easily and accurately positions the cable inside the wire-wrapped magnetic core assemblies. The elongated alignment channel allows maximum signal coupling which would otherwise be reduced proportionally with the angle of misalignment. Since the alignment channel minimizes the angle of misalignment, signal loss is reduced, inductive properties are improved and accuracy is increased.

The magnetic core assemblies are manufactured with the following process that significantly improves the price/performance ratio of the connectionless signal detection device for conductive cables. The magnetic core assemblies are first wrapped with a conductive wire, then subsequently bifurcated. This process reduces manufacturing cost and time over the traditional method of wrapping a pre-bifurcated magnetic core assembly. Additionally, the magnetic core assembly sections are positioned during signal interaction in a manner that leaves a dual gap in the operating magnetic core assembly. By allowing a dual gap to exist, it is possible to significantly reduce manufacturing cost and time by avoiding the necessity to precision fabricate one or both mating surfaces.

While the invention is susceptible to various modifications and alternate forms, specific examples thereof have been shown by way of example in the drawings and are herein described in detail. It should be understood, however, that it is not intended to limit the invention to the particular forms disclosed, but on the contrary, the invention is to cover all modifications, equivalents, and alternative falling within the spirit and scope of the invention as defined by the following claims.

I claim:

1. A connectionless signal detection device for detecting data signals present on conductive cables, comprising:

at least one magnetic core assembly having a first and a second position, and that is divided into a first assembly section and a second assembly section, each of said first assembly section and second assembly section being wrapped with a conductive wire with said assembly sections movably connected and allowing the magnetic core assembly to be placed in the first and the second positions;

an elongated alignment channel, having an encased elongated channel, disposed between said first assembly section and said second assembly section, wherein said first assembly section and said second assembly section are positioned opposed to each other, axially aligned and positioned concentrically about said elongated alignment channel;

a housing for non-removably securing the at least one magnetic core assembly;

wherein said first assembly section includes a first input wire and a first output wire and said second assembly section includes a second input wire and a second output wire, and said first assembly section and said second assembly section are electrically connected in a bucking fashion so that said first output wire from said first assembly section is connected to said second output wire of said second assembly section; and further comprising tuning circuitry coupled to said magnetic core assembly, said tuning circuitry processes signals induced on said first input wire and said second input wire and further distinguishes between signals associated with at least two networking communication signal frequencies.

2. A connectionless signal detection device for detecting data signals present on conductive cables, comprising:

at least one magnetic core assembly having a first and a second position, and that is divided into a first assembly section and a second assembly section, each of said first assembly section and second assembly section being wrapped with a conductive wire with said assembly sections movably connected and allowing the magnetic core assembly to be placed in the first and the second positions;

an elongated alignment channel having an encased elongated channel, disposed between said first assembly section and said second assembly section; wherein said first assembly section and said second assembly section are positioned opposed to each other, axially aligned and positioned concentrically about said elongated alignment channel;

a housing for non-removably securing the at least one magnetic core assembly; and detection circuitry coupled to said magnetic core assembly, wherein said detection circuitry adjusts the electrical detection characteristics of said magnetic core assembly in order to optimize said magnetic core assembly to a particular frequency.

3. A connectionless signal detection device for detecting data signals present on conductive cables, comprising:

at least one magnetic core assembly having a first and a second position, and that is divided into a first assembly section and a second assembly section, each of said first assembly section and second assembly section being wrapped with a conductive wire with said assembly sections movably connected and allowing the magnetic core assembly to be placed in the first and the second positions;

an elongated alignment channel, having an encased elongated channel, disposed between said first assembly section and said second assembly section; wherein said first assembly section and said second assembly section are positioned opposed to each other, axially aligned and positioned concentrically about said elongated alignment channel;

a housing for non-removably securing the at least one magnetic core assembly; and tuning circuitry coupled to said first and second assembly sections, said tuning circuitry processes signals received from said first and second assembly sections.

4. A connectionless signal detection device for conductive cables, comprising:

a plurality of magnetic core assemblies including a first magnetic core assembly and a second magnetic core assembly, each of the magnetic core assemblies having a first and a second position, and being divided into a first assembly section and a second assembly section, with each of the first assembly sections and second assembly sections further being wrapped with a conductive wire;

an elongated alignment channel, including an encased elongated channel; wherein said first assembly sections and said second assembly sections are positioned opposed to each other, axially aligned and positioned concentrically about said elongated alignment channel with said assembly sections movably connected and allowing the magnetic core assembly to be placed in the first and the second positions;

first tuning circuitry coupled to said first magnetic core assembly, said first tuning circuitry optimizes said first magnetic core assembly to a first frequency; and a second tuning circuitry coupled to said second magnetic core assembly, said second tuning circuitry optimizes said second magnetic core assembly to a second frequency.

* * * * *